(12) United States Patent
Kobayashi et al.

(10) Patent No.: US 9,137,896 B2
(45) Date of Patent: Sep. 15, 2015

(54) WIRING SUBSTRATE

(71) Applicant: SHINKO ELECTRIC INDUSTRIES CO., LTD., Nagano-shi, Nagano (JP)

(72) Inventors: Kazuhiro Kobayashi, Nagano (JP); Kotaro Kodani, Nagano (JP); Junichi Nakamura, Nagano (JP); Kentaro Kaneko, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/021,110

(22) Filed: Sep. 9, 2013

(65) Prior Publication Data

US 2014/0076614 A1    Mar. 20, 2014

(30) Foreign Application Priority Data

Sep. 20, 2012    (JP) ................. 2012-206743

(51) Int. Cl.
| | |
|---|---|
| H05K 1/00 | (2006.01) |
| H05K 1/03 | (2006.01) |
| H05K 1/02 | (2006.01) |
| H05K 1/11 | (2006.01) |
| H05K 3/46 | (2006.01) |
| H05K 3/10 | (2006.01) |

(52) U.S. Cl.
CPC ............ *H05K 1/0298* (2013.01); *H05K 3/4682* (2013.01); *H05K 3/108* (2013.01); *H05K 2201/09563* (2013.01); *H05K 2203/0152* (2013.01)

(58) Field of Classification Search
USPC .................. 174/251, 255, 256, 258, 259, 262
See application file for complete search history.

(56) References Cited

U.S. PATENT DOCUMENTS

| | | | | |
|---|---|---|---|---|
| 5,055,321 | A  * | 10/1991 | Enomoto et al. | 427/97.2 |
| 5,589,250 | A  * | 12/1996 | Asai et al. | 428/209 |
| 6,560,863 | B2 * | 5/2003 | Koyama et al. | 29/846 |
| 2007/0051459 | A1* | 3/2007 | Yamano et al. | 156/253 |
| 2007/0116964 | A1* | 5/2007 | Guo et al. | 428/414 |
| 2009/0288870 | A1* | 11/2009 | Kondo et al. | 174/261 |
| 2011/0031003 | A1* | 2/2011 | Paul et al. | 174/258 |
| 2011/0220399 | A1* | 9/2011 | Niki | 174/258 |

FOREIGN PATENT DOCUMENTS

| | | |
|---|---|---|
| JP | H11-289163 | 10/1999 |
| JP | 2008-153580 A1 | 7/2008 |
| JP | 2009-88429 A1 | 4/2009 |

* cited by examiner

*Primary Examiner* — Timothy Thompson
*Assistant Examiner* — Sherman Ng
(74) *Attorney, Agent, or Firm* — Kratz, Quintos & Hanson, LLP (57) ABSTRACT

A wiring substrate includes a first insulating layer, an adhesion insulating layer formed under the first insulating layer and an outer face of the adhesion insulating layer is made to a roughened face, a first wiring layer formed on the first insulating layer, a second insulating layer formed on the first insulating layer, and in which a first via hole reaching the first wiring layer is provided, a second wiring layer formed on the second insulating layer, and connected to the first wiring layer through the first via hole, a second via hole formed in the adhesion insulating layer and the first insulating layer, and reaching the first wiring layer, and a third wiring layer formed on the outer face of the adhesion insulating layer, and connected to the first wiring layer through the second via hole.

3 Claims, 8 Drawing Sheets

FIG. 7B desmear process

WIRING SUBSTRATE

CROSS-REFERENCE TO RELATED APPLICATIONS

This application is based upon and claims the benefit of priority of the prior Japanese Patent Application No. 2012-206743, filed on Sep. 20, 2012, the entire contents of which are incorporated herein by reference.

FIELD

It is related to a wiring substrate.

BACKGROUND

In the prior art, there are wiring substrates for mounting electronic components such as semiconductor chips. As such wiring substrates, there are coreless type wiring substrates having no core substrate. The coreless type wiring substrates are manufactured based on forming desired build-up wiring layers on a supporting member and then removing the supporting member. A related art is disclosed in Japanese Laid-open Patent Publication No. 11-289163, Japanese Laid-open Patent Publication No. 2008-153580, and Japanese Laid-open Patent Publication No. 2009-88429.

SUMMARY

As explained in the column of preliminary matter described later, in the method of manufacturing the coreless type wiring substrate, the lowermost resin layer in build-up wiring layers formed on a supporting member is repeatedly subjected to a heating process every time a resin layer is stacked to the upper side. By this matter, the lowermost resin layer in the build-up wiring layers has a longer heating history than the other resin layers and is therefore firmly cured.

Therefore, after the supporting member is removed and then via holes are formed in the lowermost resin layer, when the surface of the lowermost resin layer is subjected to a desmear process and is roughened, an adequately roughened face cannot be obtained. For this reason, there is such a problem that when the wiring layer is formed on the exposed face of the lowermost resin layer, the sufficient adhesion of the wiring layer cannot be obtained.

According to one aspect of the invention, there is provided a wiring substrate, including, a first insulating layer, an adhesion insulating layer formed under the first insulating layer, and an outer face of the adhesion insulating layer is made to a roughened face, a first wiring layer formed on the first insulating layer, a second insulating layer formed on the first insulating layer, and in which a first via hole reaching the first wiring layer is provided, a second wiring layer formed on the second insulating layer, and connected to the first wiring layer through the first via hole, a second via hole formed in the adhesion insulating layer and the first insulating layer, and reaching the first wiring layer, and a third wiring layer formed on the outer face of the adhesion insulating layer, and connected to the first wiring layer through the second via hole.

According to another aspect of the invention, there is provided a method of manufacturing a wiring substrate including, forming a first insulating layer on a supporting member, forming a first wiring layer on the first insulating layer, forming a second insulating layer on the first insulating layer, the second insulating layer covering the first wiring layer, forming a first via hole in the second insulating layer, the first via hole reaching the first wiring layer, forming a second wiring layer on the second insulating layer, the second wiring layer connected to the first wiring layer through the first via hole, removing the supporting member to expose a lower face of the first insulating layer, forming an adhesion insulating layer on the exposed face of the first insulating layer, forming a second via hole in the adhesion insulating layer and the first insulating layer, the second via hole reaching the first wiring layer, roughening an exposed face of the adhesion insulating layer, and forming a third wiring layer on the exposed face of the adhesion insulating layer, the third wiring layer connected to the first wiring layer through the second via hole.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, preferred embodiments of the present invention will be explained with reference to the accompanying drawings.

Figure 1A:
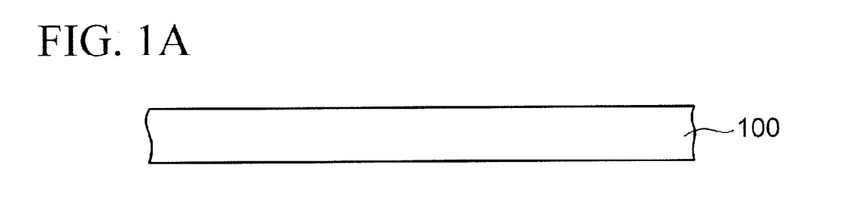
FIGS. 1A to 1E are cross-sectional views depicting a method of manufacturing a wiring substrate according to a preliminary matter (Part 1).
Figure 1B:
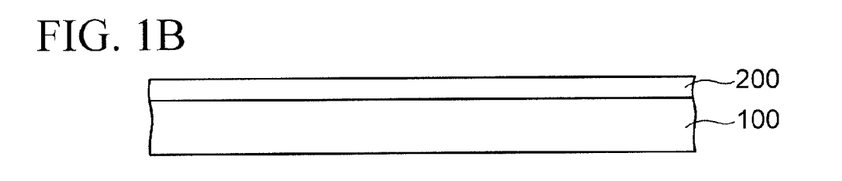

Prior to the explanation of an embodiment, the preliminary matter to be set forth as a basis will be explained hereunder. In a method of manufacturing a coreless type wiring substrate, as depicted in FIG. 1A, first, a supporting member 100 such as a copper plate is prepared. Then, as depicted in FIG. 1B, a semi-cured resin film is attached to the supporting member 100 and heated at a temperature of about 190° C. to cure the resin film, so that a first resin layer 200 is obtained.

Figure 1C:
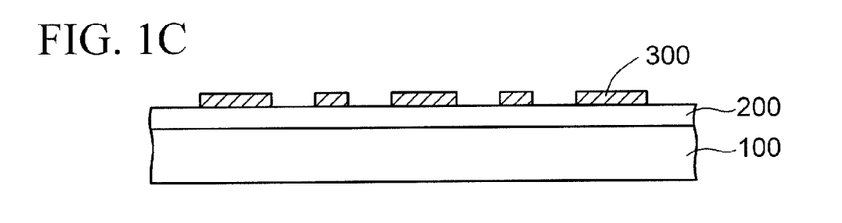
Figure 1D:
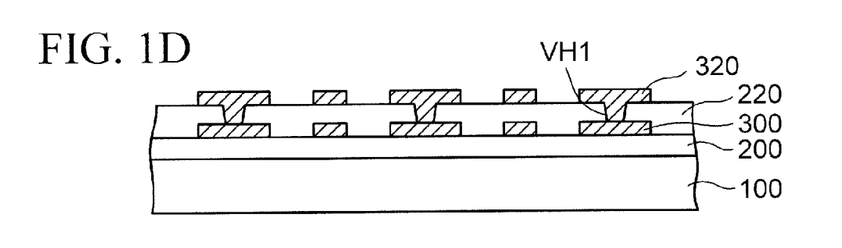

Then, as depicted in FIG. 1C, a first wiring layer 300 is formed on the first resin layer 200. Thereafter, as depicted in FIG. 1D, a second resin layer 220 is formed on the first resin layer 200 by a method similar to the method of forming the first resin layer 200, the second resin layer 220 covers the first wiring layer 300. Further, the second resin layer 220 is processed by a laser or the like to form first via holes VH1 reaching the first wiring layer 300.

Then, as depicted in FIG. 1D similarly, a second wiring layer 320 is formed on the second resin layer 220, the second wiring layer 320 being connected to the first wiring layer 300 through the first via holes VH1.

Figure 1E:
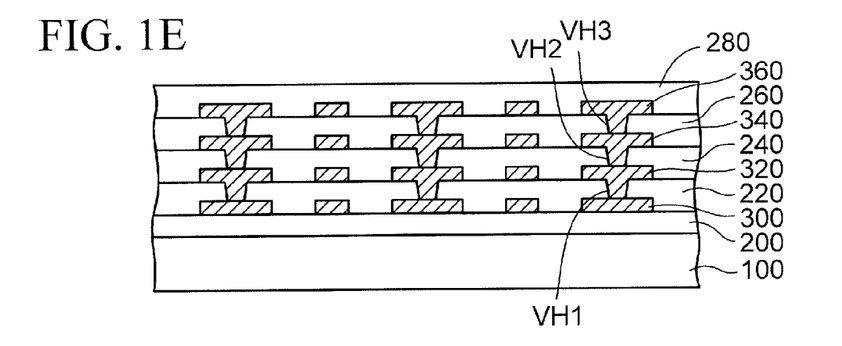

Thereafter, as depicted in FIG. 1E, similar steps are repeated to form a third wiring layer 340 on a third resin layer 240, the third wiring layer 340 being connected to the second wiring layer 320 through second via holes VH2 provided in the third resin layer 240.

Further, similar steps are repeated to form a fourth wiring layer 360 on a fourth resin layer 260, the fourth wiring layer 360 being connected to the third wiring layer 340 through third via holes VH3 provided in the fourth resin layer 260. Thereafter, a fifth resin layer 280 is formed which covers the fourth wiring layer 360.

In this way, four build-up wiring layers are formed on the supporting member 100.

Figure 2A:
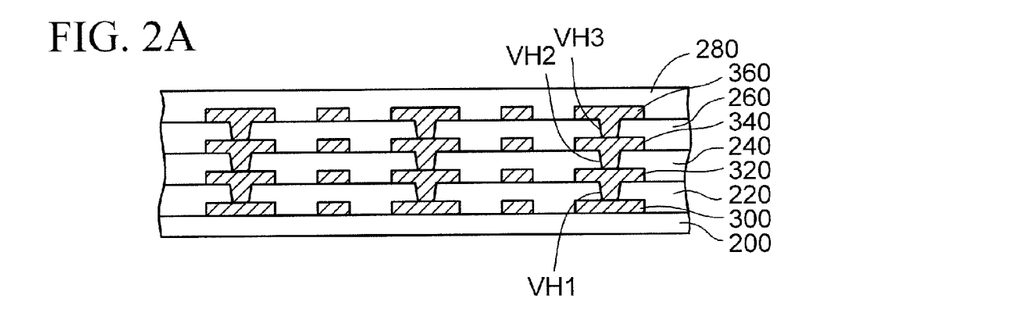
FIGS. 2A to 2C are cross-sectional views depicting the method of manufacturing a wiring substrate according to the preliminary matter (Part 2).

Then, as depicted in FIG. 2A, the supporting member 100 is removed by wet etching to expose the lower face of the first resin layer 200.

Figure 2B:
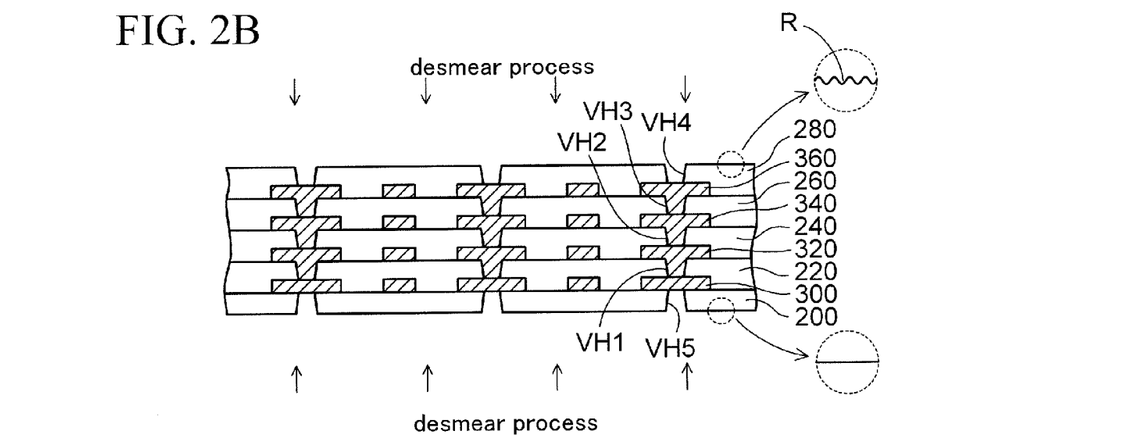

Thereafter, as depicted in FIG. 2B, the fifth resin layer 280 is processed by a laser or the like to form fourth via holes VH4 reaching the fourth wiring layer 360. Further, the first resin layer 200 is processed by a laser or the like to form fifth via holes VH5 reaching the lower face of the first wiring layer 300.

Then, as depicted in FIG. 2B similarly, a desmear process using a potassium permanganate solution or the like is performed on both sides in the fourth via holes VH4 and the fifth via holes VH5. By this matter, the resin smears remaining in the bottoms of the fourth and fifth via holes VH4 and VH5 are cleaned.

In this time, simultaneously, surfaces of the first resin layer 200 and the fifth resin layer 280 are etched by the desmear processes.

Meanwhile, the first resin layer 200 is repeatedly subjected to a heating process every time each of the second to fifth resin layers 220, 240, 260, and 280 is formed. For this reason, the first resin layer 200 has a longer heating history than the other resin layers and is therefore firmly cured.

Thus, as depicted in the partially enlarged cross-sectional views in FIG. 2B, when the desmear process is performed, the sufficient roughness is formed on the surface of the fifth resin layer 280 by etching, thus the surface of the fifth resin layer 280 is formed as a desired roughened face R, whereas the surface of the first resin layer 200 is hard to etch and is therefore not roughened sufficiently.

Figure 2C:
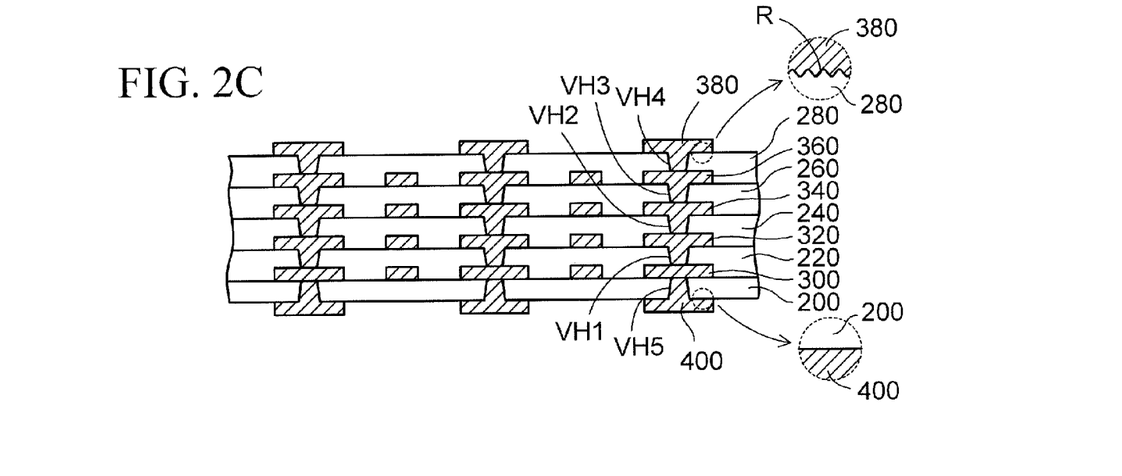

Then, as depicted in FIG. 2C, a fifth wiring layer 380 is formed on the fifth resin layer 280, the fifth wiring layer 380 being connected to the fourth wiring layer 360 through the fourth via holes VH4. Since the surface of the fifth resin layer 280 is an adequately roughened face R, the fifth wiring layer 380 is formed on the fifth resin layer 280 with good adhesion.

Moreover, as depicted in FIG. 2C similarly, a sixth wiring layer 400 is formed on the lower face of the first resin layer 200, the sixth wiring layer 400 being connecting to the first wiring layer 300 through the fifth via holes VH5. Since the lower face of the first resin layer 200 is not sufficiently roughened, there is a problem that the sufficient adhesion cannot be obtained between the sixth wiring layer 400 and the first resin layer 200.

In the case that the sixth wiring layer 400 is formed by a semi-additive method, when a seed layer is formed by electroless plating, the seed layer is detached from the first resin layer 200, thus a bulge is easy to occur.

For this reason, when the sixth wiring layer 400 is formed on the lower face of the first resin layer 200, the device that the line width is thickened, or the like is needed for the detachment countermeasure. Therefore, it becomes difficult to form the sixth wiring layer 400 with the same design rule as those of the wiring layers formed on the other resin layers, and a limitation on the design is caused.

The embodiment to be described below can solve the problem mentioned above.

Embodiment

Figure 6A:
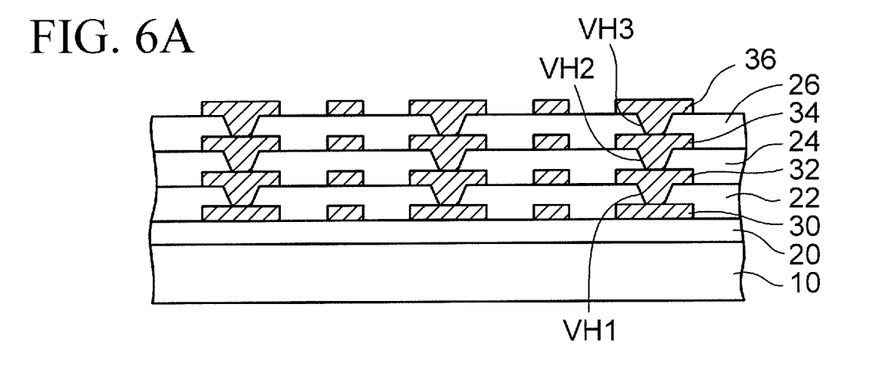
FIGS. 6A to 6C are cross-sectional views depicting the method of manufacturing a wiring substrate of the embodiment (Part 2).
Figure 6B:
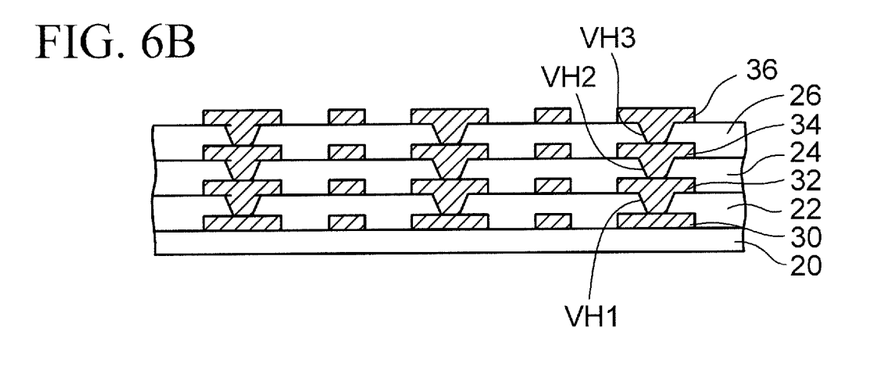
Figure 6C:
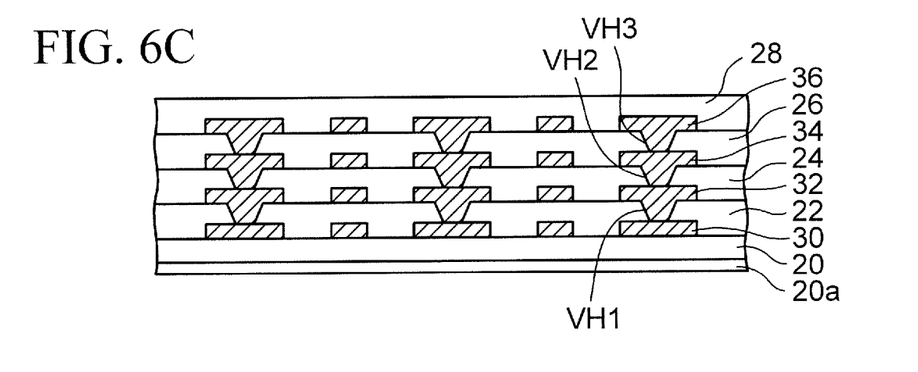
Figure 7A:
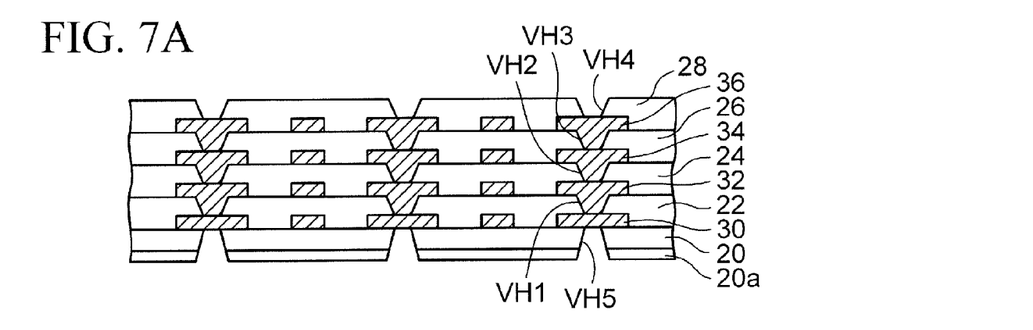
FIGS. 7A to 7C are cross-sectional views depicting the method of manufacturing a wiring substrate of the embodiment (Part 3).
Figure 7B:
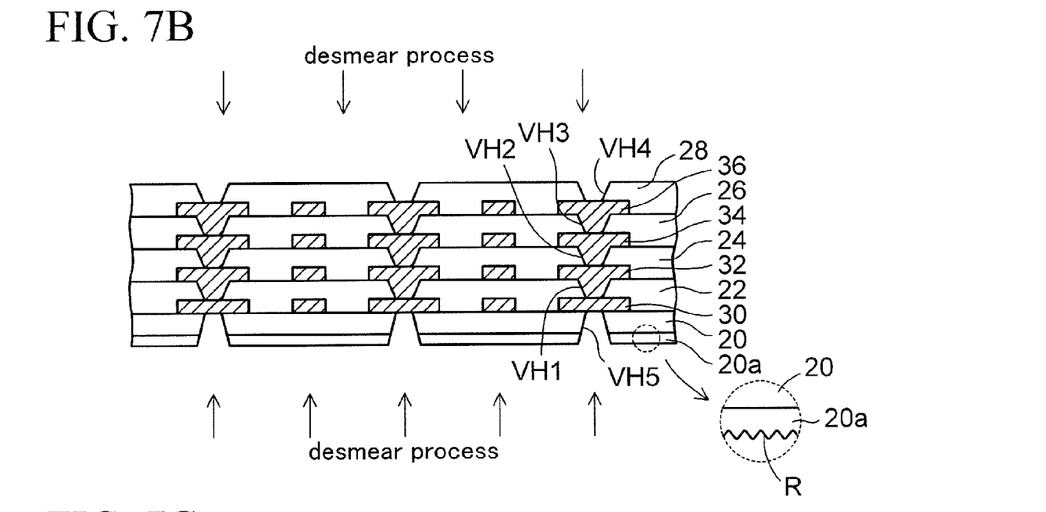
Figure 7C:
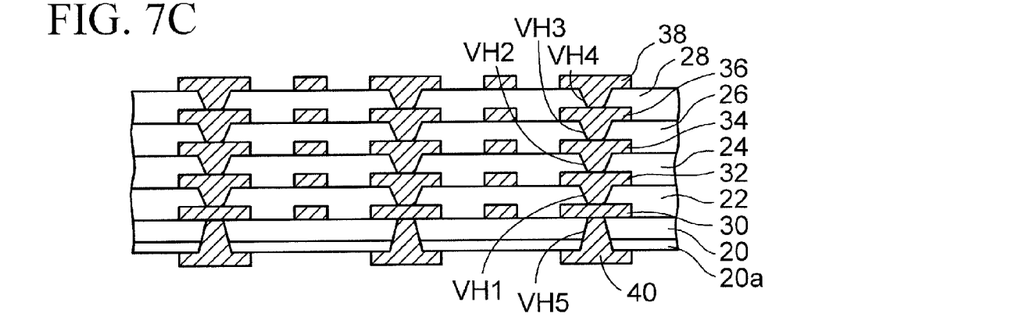
Figure 8:
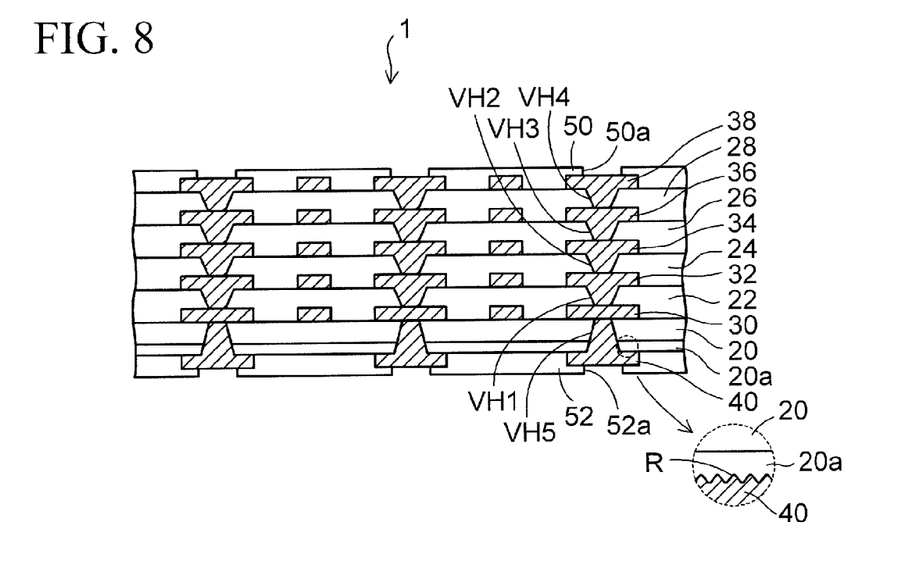
FIG. 8 is a cross-sectional view depicting a wiring substrate of the embodiment.

FIGS. 3A to 7C are cross-sectional views depicting a method of manufacturing a wiring substrate of the embodiment, and FIG. 8 is a cross-sectional view depicting a wiring substrate of the embodiment. Hereinafter, while explaining a method of manufacturing a wiring substrate according to the embodiment, a structure of the wiring substrate will be explained.

Figure 3A:
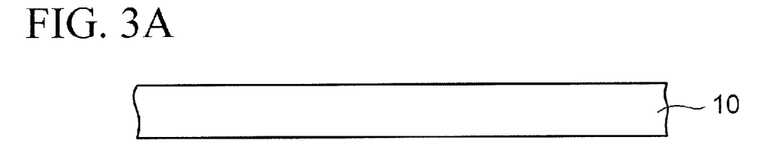
FIGS. 3A to 3E are cross-sectional views depicting a method of manufacturing a wiring substrate of an embodiment (Part 1).

In the method of manufacturing a wiring substrate of the embodiment, as depicted in FIG. 3A, first, a supporting member 10 is prepared. The supporting member 10 is formed of a metal plate, for example, and is formed of a copper plate or a copper foil whose thickness is 150 μm to 500 μm as one example.

Figure 3B:
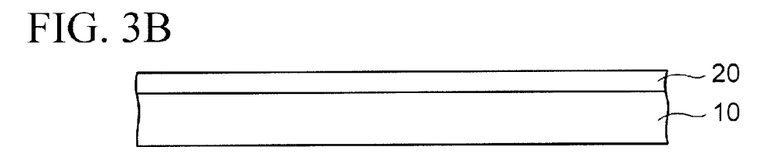

Then, as depicted in FIG. 3B, a semi-cured resin film is attached to the supporting member 10, and a heating process is performed at a temperature of about 190° C. to cure the resin film. By this matter, a first resin layer 20 whose thickness is about 20 μm is obtained. As the resin film, a thermosetting epoxy resin, a thermosetting polyimide resin, or the like is used. Then, the surface of the first resin layer 20 is etched by a potassium permanganate solution or the like, thus the surface of the first resin layer 20 is made to a roughened face.

Figure 3C:
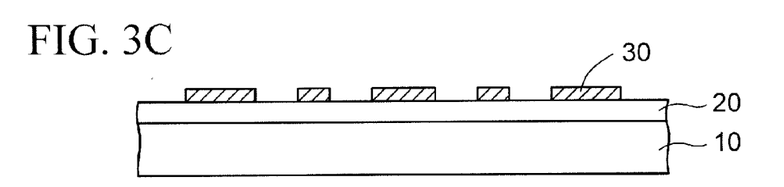

Thereafter, as depicted in FIG. 3C, a first wiring layer 30 whose thickness is about 20 μm is formed on the first resin layer 20.

Figure 4A:
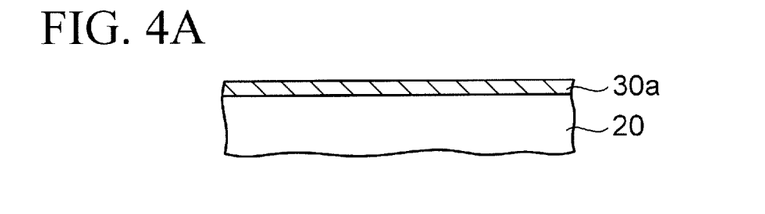
FIGS. 4A to 4E are cross-sectional views depicting a method of forming a first wiring layer in FIG. 3C.
Figure 4B:
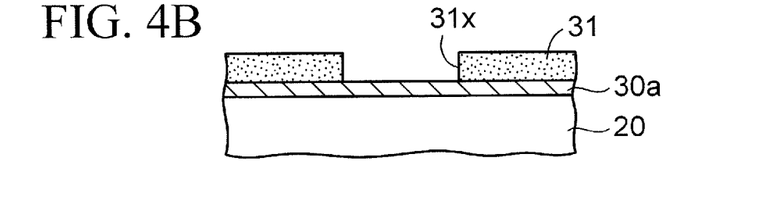

The first wiring layer 30 is formed by a semi-additive method, for example. Explaining in more detail, as depicted in FIG. 4A, first, a seed layer 30a made of copper or the like is formed on the first resin layer 20 by electroless plating or sputtering. Then, as depicted in FIG. 4B, a plating resist 31 is formed on the seed layer 30a based on photolithography, the plating resist 31 having opening portions 31x provided on parts where the first wiring layer 30 is arranged.

Figure 4C:
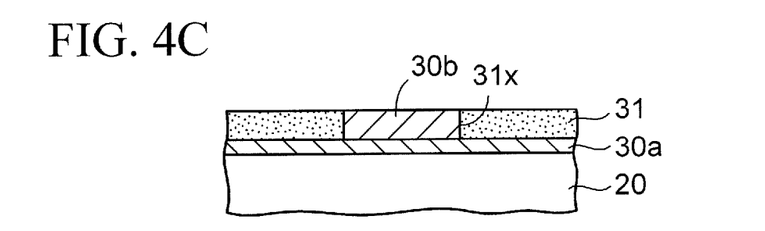

Further, as depicted in FIG. 4C, a plating layer 30b made of copper or the like is formed in the opening portions 31x in the plating resist 31 by electroplating utilizing the seed layer 30a as a plating power feeding path.

Figure 4D:
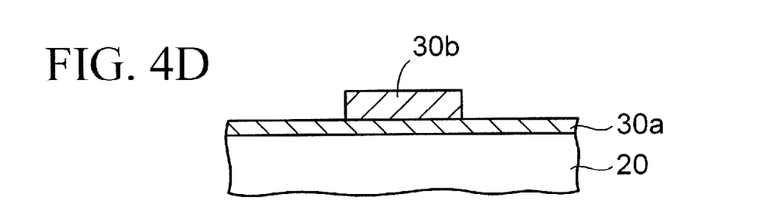
Figure 4E:
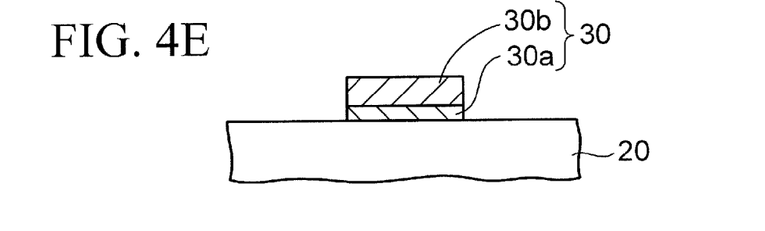

Then, as depicted in FIG. 4D, the plating resist 31 is removed. Thereafter, as depicted in FIG. 4E, the seed layer 30a is etched and removed while using the plating layer 30b as a mask. By this matter, the first wiring layer 30 formed by the seed layer 30a and the plating layer 30b is obtained.

Subsequently, referring back to FIG. 3D to resume the description, a semi-cured resin film is attached on the first resin layer 20 and the first wiring layer 30, and a heating process is performed at a temperature of about 190° C. to cure the resin film. By this matter, a second resin layer 22 whose thickness is about 30 μm is obtained. The second resin layer 22 is formed as an interlayer insulating layer. The same applies to third to fifth resin layers to be described later.

Figure 3D:
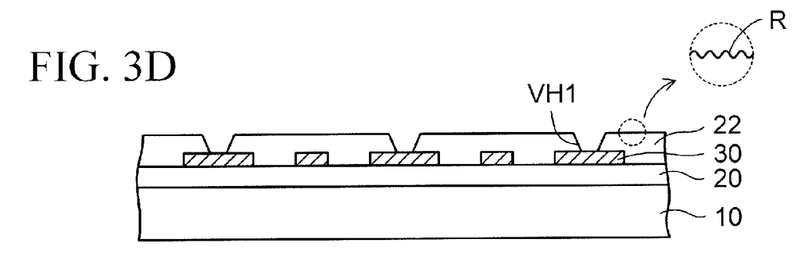

Further, the second resin layer 22 is processed by a laser or the like to form first via holes VH1 reaching the first wiring layer 30. The diameter of each first via hole VH1 is set to 60 μm to 70 μm, for example.

The first via hole VH1 is formed from the upper face side of the second resin layer 22 by the laser, or the like. Therefore, each first via hole VH1 is formed to have a forward tapered shape whose diameter is set small gradually from the surface of the second resin layer 22 toward the thickness direction thereof.

Thereafter, a desmear process using a potassium permanganate solution or the like is performed in the inside of the first via holes VH1. By this matter, the resin smears remaining on the bottoms of the first via holes VH1 are cleaned. In this time, simultaneously, as depicted in the partially enlarged cross-sectional view in FIG. 3D, by the desmear process, the side face of each first via hole VH1 and the surface of the second resin layer 22 are roughened, thus the surface of the second resin layer 22 is made to a roughened face R.

The surface roughness of the roughened face R of the second resin layer 22 is set to 500 nm or lower and preferably to 100 nm to 400 nm. The surface roughness of the other resin layers is set within the same range as the second resin layer 22.

Although a permanganate method is illustrated as the method of the desmear process, plasma etching, blasting, or the like may be used. In the case that the plasma etching, the desmear process is performed by using a dry etching equipment using a mixed gas in which $O_2$, $N_2$, or the like is mixed to $CF_4$, for example.

Figure 3E:
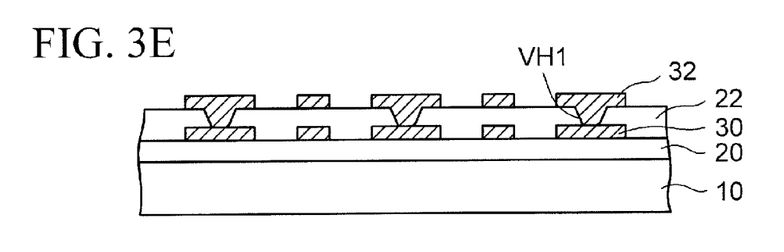

Then, as depicted in FIG. 3E, a second wiring layer 32 is formed on the second resin layer 22, the second wiring layer 32 being connected to the first wiring layer 30 through the first via holes VH1. Since the surface of the second resin layer 22 is adequately roughened, the second wiring layer 32 is formed on the second resin layer 22 with good adhesion by the anchor effect. For the same reason, the first wiring layer 30 mentioned above is formed on the first resin layer 20 with good adhesion as well.

Figure 5A:
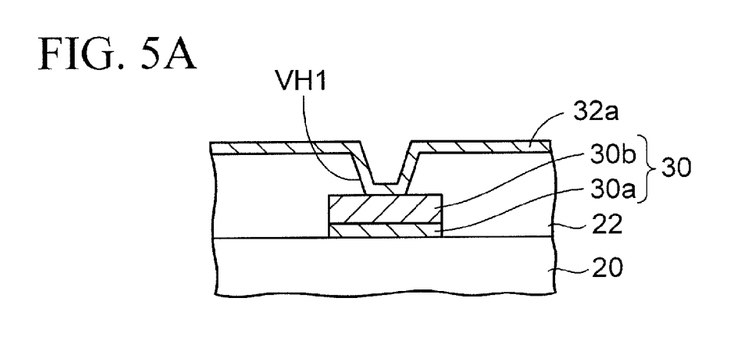
FIGS. 5A to 5D are cross-sectional views depicting a method of forming a second wiring layer in FIG. 3E.

The second wiring layer 32 is formed by a semi-additive method, for example. Explaining in more detail, as depicted in FIG. 5A, first, a seed layer 32a made of copper or the like is formed on the second resin layer 22 and on the inner face of each first via hole VH1 by electroless plating or sputtering.

Figure 5B:
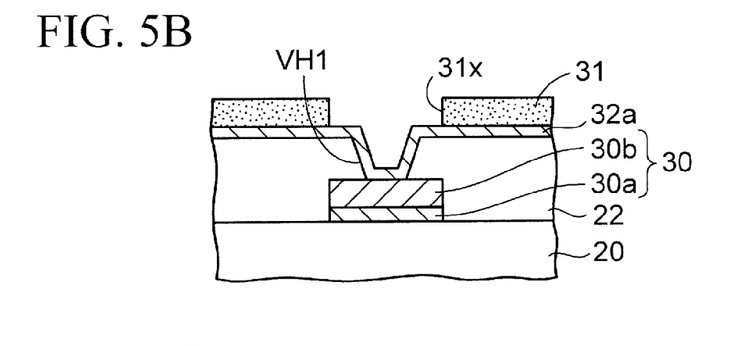

Further, as depicted in FIG. 5B, a plating resist 31 is formed on the seed layer 32a based on photolithography, the plating resist 31 having opening portions 31x provided on parts where the second wiring layer 32 is arranged.

Figure 5C:
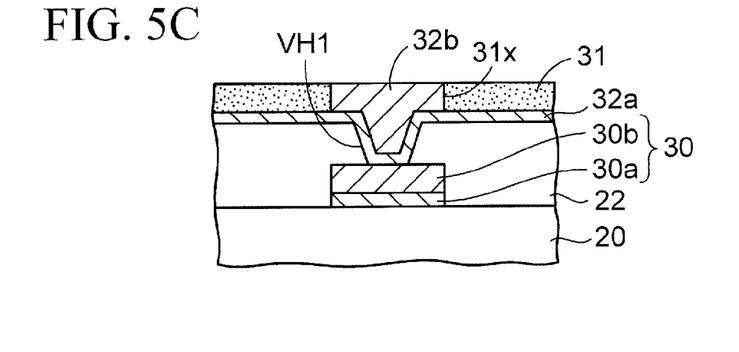

Then, as depicted in FIG. 5C, a plating layer 32b made of copper or the like is formed in the region from the inside of the first via holes VH1 to the opening portions 31x of the plating resist 31 by electroplating utilizing the seed layer 32a as a plating power feeding path.

Figure 5D:
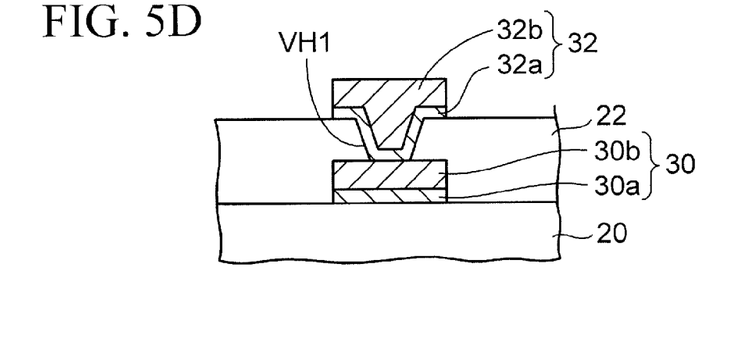

Then, as depicted in FIG. 5D, the plating resist 31 is removed, and thereafter, the seed layer 32a is etched and removed while using the plating layer 32b as a mask. By this matter, the second wiring layer formed by the seed layer 32a and the plating layer 32b is obtained. The second wiring layer 32 is formed to include a via conductor filled in the first via hole VH1.

It is preferable to form the other wiring layers by a semi-additive method as well. However, a different wiring forming method such as a subtractive method or a full-additive method may be used.

Then, as depicted in FIG. 6A, similar steps are repeated to form a third wiring layer 34 on a third resin layer 24, the third wiring layer 34 being connected to the second wiring layer 32 through second via holes VH2 formed in the third resin layer 24.

Further, similar steps are repeated to form a fourth wiring layer 36 on a fourth resin layer 26, the fourth wiring layer 36 being connected to the third wiring layer 34 through third via holes VH3 formed in the fourth resin layer 26.

Thereafter, as depicted in FIG. 6B, the supporting member 10 is removed by etching. In the case that the supporting member 10 is made of copper, as the etchant for the supporting member 10, an alkaline etching solution mainly containing ammonia, an iron(III) chloride aqueous solution, a copper (II) chloride aqueous solution, or the like is used. By this matter, the supporting member 10 can be selectively removed from the first resin layer 20.

As described in the above the preliminary matter, the lowermost first resin layer 20 is subjected to a heating process every time each of the second to fourth resin layers 22, 24, and 26 is formed. Thus, the first resin layer 20 has a longer heating history and is therefore firmly cured. Accordingly, even if a roughening process is performed on the exposed face of the lowermost first resin layer 20, it is difficult to obtain a sufficiently roughened face.

For this reason, as depicted in FIG. 6C, an adhesion resin layer 20a is stacked and formed on the lower face of the first resin layer 20. Like the other resin layers, the adhesion resin layer 20a is obtained by attaching a semi-cured resin film and curing it by a heating process.

Moreover similarly, the adhesion resin layer 20a is formed of a thermosetting epoxy resin, a thermosetting polyimide resin, or the like. Since the adhesion resin layer 20a is not subjected to excessive heating process, a roughened face can be easily formed thereon by a desmear process.

The interlayer insulating layer is formed by the first resin layer 20 and the adhesion resin layer 20a. In the case that the thickness of the first resin layer 20 is 20 μm, the thickness of the adhesion resin layer 20a is set to about 10 μm, so that their total thickness is set equal to the thickness of each of the second to fourth resin layers 22, 24, and 26.

Further, a fifth resin layer 28 is formed on the fourth resin layer 26 and the fourth wiring layer 36 by a similar method.

Then, as depicted in FIG. 7A, on the upper face side in FIG. 6C, the fifth resin layer 28 is processed by a laser or the like to form fourth via holes VH4 reaching the upper face of the fourth wiring layer 36.

Moreover similarly, on the lower face side in FIG. 6C, the adhesion resin layer 20a and the first resin layer 20 are processed by a laser or the like to form fifth via holes VH5 reaching the lower face of the first wiring layer 30.

Each fifth via hole VH5 is formed from the lower face side of the adhesion resin layer 20a and first resin layer 20 by a laser or the like. Therefore, the fifth via hole VH5 is formed to have a reverse tapered shape whose diameter is set small gradually from the surface of the adhesion resin layer 20a toward the thickness direction of the first resin layer 20. The fifth via hole VH5 is formed to have the tapered shape reverse to the shape of the first via holes VH1.

Further, as depicted in FIG. 7B, a desmear process using a potassium permanganate solution or the like is performed on both faces of the structure in FIG. 7A. By this matter, the resin smears remaining on the bottoms of the fourth and fifth via holes VH4 and VH5 are cleaned.

In this time, simultaneously, by the desmear process, the roughness is formed on the side faces of the fourth and fifth via holes VH4 and VH5 and the surfaces of the fifth resin layer 28 and the adhesion resin layer 20a, thus the surfaces of them are made to a roughened face R.

The partially enlarged cross-sectional view in FIG. 7B depicts the state that the roughened face R is formed on the outer face of the adhesion resin layer 20a.

In this way, the adhesion resin layer 20a is formed on the lower face of the lowermost first resin layer 20 that is subject to excessive heating process and has the property in which the formation of the roughened face is difficult. By this matter, the roughened face R can be formed on the lower face side of the first resin layer 20.

Accordingly, the surface roughness of the outer face of the adhesion resin layer 20a can be set within the same range as that of the surface roughness of the upper face of each of the first to fifth resin layer 20, 22, 24, 26, and 28.

Then, as depicted in FIG. 7C, on the upper face side of the structure in FIG. 7B, a fifth wiring layer 38 is formed on the fourth resin layer 26, the fifth wiring layer 38 being connected to the fourth wiring layer 36 through the fourth via holes VH4.

Further, as depicted in FIG. 7C similarly, on the lower face side of the structure in FIG. 7B, a sixth wiring layer 40 is formed on the outer face of the adhesion resin layer 20a, the sixth wiring layer 40 being connected to the first wiring layer 30 through the fifth via holes VH5.

The adhesion resin layer 20a whose outer face is adequately roughened is formed on the lower face of the first resin layer 20. Therefore, like the other wiring layers, the sixth wiring layer 40 formed on the lower face side of the lowermost first resin layer 20 is formed on the first resin layer 20 through the adhesion resin layer 20a with good adhesion as well.

In the case that The semi-additive method explained in the method of forming the second wiring layer 32 mentioned above is used, when a seed layer is formed by electroless plating, the seed layer is hard to be detached from the adhesion resin layer 20a and the bulge does not occur. Thus, a fine sixth wiring layer 40 can be formed at a good yield.

In this way, in the wiring substrate of this embodiment, all the resin layers on which wiring layers are formed are adequately roughened. Thus, in the wiring layers of all the layers, sufficient adhesion is secured. For this reason, all the wiring layers in the build-up wiring layers can be formed with the same design rule, thereby the limitation on the design is not caused.

For example, the wiring layers in all the layers can be formed at narrow pitches of 10 μm to 30 μm at a good yield.

Subsequently as depicted in FIG. 8, a solder resist 50 is formed on the fifth resin layer 28, the solder resist 50 having opening portions 50a provided on connection parts of the uppermost fifth wiring layer 28. Moreover similarly, a solder resist 52 is formed on the adhesion resin layer 20a, the solder resist 52 having opening portions 52a provided on connection parts of the lowermost sixth wiring layer 40.

Further, as the need arises, a contact layer (not depicted) is provided on the respective connection parts of the fifth wiring layer 38 and the sixth wiring layer 40 by forming a Ni/Au plating layer, or the like.

By the above steps, a wiring substrate 1 of this embodiment is obtained.

In the mode described above, five build-up wiring layers are formed on the upper side of the first resin layer 20, and one wiring layer is formed on the lower side of the first resin layer 20. However, the number of wiring layers to be stacked on each of the upper and lower sides of the first resin layer 20 can be set to arbitrary number.

Moreover, although an insulating resin is used as each interlayer insulating layer and the adhesion insulating layer, it is possible to use a different insulating material.

As depicted in FIG. 8, in the wiring substrate 1 of this embodiment, as the lowermost layer among the interlayer insulating layers formed between the wiring layers, the first resin layer 20 and the adhesion resin layer 20a formed under the first resin layer are arranged. The first wiring layer 30 is formed on the first resin layer 20. Moreover, the second resin layer is formed on the first resin layer 20, the second resin layer 22 in which the first via holes VH1 reaching the first wiring layer 30 are provided.

Further, the second wiring layer 32 is formed on the second resin layer 22 and connected to the first wiring layer 30 through the first via holes VH1.

Moreover similarly, the third wiring layer 34 is formed on the third resin layer 24 and connected to the second wiring layer 32 through the second via holes VH2 provided in the third resin layer 24.

Further similarly, the fourth wiring layer 36 is formed on the fourth resin layer 26 and connected to the third wiring layer 34 through the third via holes VH3 provided in the fourth resin layer 26.

Furthermore similarly, the fifth wiring layer 38 is formed on the fifth resin layer 28 and connected to the fourth wiring layer 36 through the fourth via holes VH4 provided in the fifth resin layer 28. The solder resist 50 is formed on the fifth resin layer 28, the solder resist 50 having the opening portions 50a provided on the connection parts of the fifth wiring layer 38.

Further, the fifth via holes VH5 are formed in the adhesion resin layer 20a and the first resin layer 20 and reach the connection parts of the lower face of the first wiring layer 30. The sixth wiring layer 40 is formed on the lower face of the adhesion resin layer 20a and is connected to the first wiring layer 30 through the fifth via holes VH5. The solder resist 52 in which the opening portions 52a are provided on the connection parts of the sixth wiring layer 40 is formed under the adhesion resin layer 20a.

As depicted in the partially enlarged cross-sectional view in FIG. 8, the lower face of the adhesion resin layer 20a on which the sixth wiring layer 40 is formed is made to the roughened face R. The surface roughness of the roughened face R of the adhesion resin layer 20a is set to 500 nm, or less and preferably within a range of 100 nm to 400 nm.

Since the lower face of the adhesion resin layer 20a is adequately roughened, the sixth wiring layer 40 is formed on the lower face of the first resin layer 20 with good adhesion through the adhesion resin layer 20a.

Moreover, the surface roughness of the lower face of the adhesion resin layer 20a is set within the same range as that of the surface roughness of the upper face of each of the first to fifth resin layer 20, 22, 24, 26, and 28. By this matter, each of the first to fifth wiring layers 30, 32, 34, 36, and 38 is formed on the corresponding resin layer with good adhesion.

As mentioned earlier, in the method of manufacturing a coreless type wiring substrate, it is difficult to roughen the exposed face of the lowermost first resin layer 20 exposed as a result of removing the supporting member 10. For this reason, the adhesion resin layer 20a is formed on the exposed face of the first resin layer 20.

Since the adhesion resin layer 20a is not subjected to excessive heating process, an adequately roughened face can be formed thereon by a desmear process.

By this matter, the sixth wiring layer 40 can be formed on the exposed face of the first resin layer 20 with good adhesion through the adhesion resin layer 20a.

In the wiring substrate 1 of this embodiment, the first via holes VH1 formed in the second resin layer 22 are formed from the upper face side of the second resin layer 22 by a laser or the like. Thus, each first via hole VH1 is formed to have a forward tapered shape whose diameter is set small gradually from the surface of the second resin layer 22 toward the thickness direction. It is similar in the second to fourth via holes (VH2 to VH4).

On the other hand, the fifth via holes VH5 formed in the adhesion resin layer 20a and the first resin layer 20 are formed from the lower face side of the adhesion resin layer 20a by a laser or the like. For this reason, each fifth via hole VH5 is formed to have the tapered shape reverse to the shape of the first via holes VH1.

Figure 9:
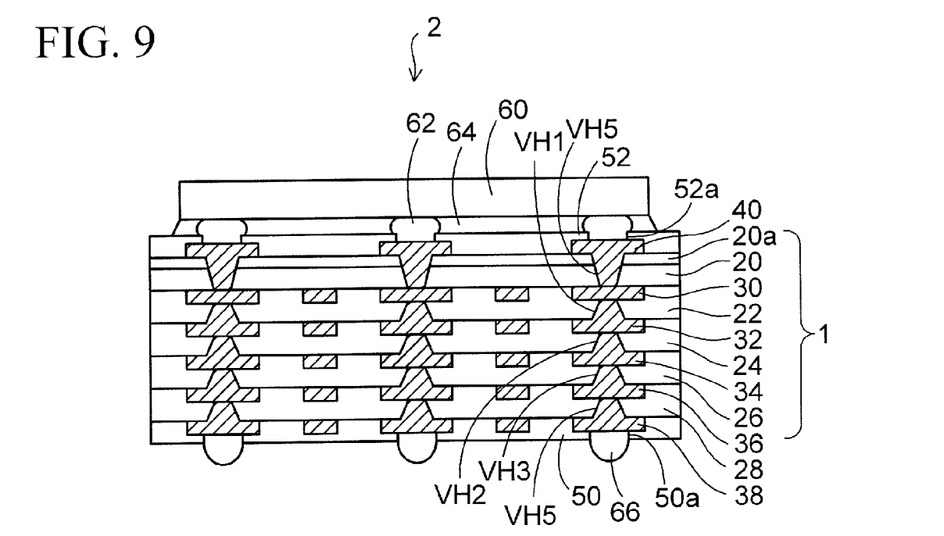
FIG. 9 is a cross-sectional depicting an example of a semiconductor device using the wiring substrate in FIG. 8.

FIG. 9 depicts an example of a semiconductor device utilizing the wiring substrate 1 in FIG. 8. As depicted in FIG. 9, in a semiconductor device 2, the wiring substrate 1 in FIG. 8 is reversed up and down, and a semiconductor chip 60 is flip-chip connected to the connection parts of the sixth wiring layer 40 through bump electrodes 62.

Moreover, underfill resin 64 is filled in the gap between the semiconductor chip 60 and the wiring substrate 1. Further, external connection terminals 66 are provided on the connection parts of the fifth wiring layer 38 located to the face opposed to the face on which the semiconductor chip 60 is mounted, by mounting solder balls, or the like.

Then, the external connection terminals 66 of the semiconductor device 2 are connected to a mounting substrate such as a motherboard.

By the wiring layers in the wiring substrate 1, the narrow pitch of the sixth wiring layer 40 on the upper face side corresponding to the semiconductor chip 60 is converted so as to correspond to the wide pitch of the mounting substrate.

Alternatively, the reverse is possible, the semiconductor chip may be flip-chip connected to the connection parts of the fifth wiring layer 38 on the upper face side of the wiring substrate 1 in FIG. 8, and the external connection terminals may be provided on the sixth wiring layer 40 on the opposite face side.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

Further, the clauses are disclosed about the above embodiment hereinafter.

(Clause 1) A method of manufacturing a wiring substrate, comprising:
  forming a first insulating layer on a supporting member;
  forming a first wiring layer on the first insulating layer;
  forming a second insulating layer on the first insulating layer, the second insulating layer covering the first wiring layer;
  forming a first via hole in the second insulating layer, the first via hole reaching the first wiring layer;
  forming a second wiring layer on the second insulating layer, the second wiring layer connected to the first wiring layer through the first via hole;
  removing the supporting member to expose a lower face of the first insulating layer;
  forming an adhesion insulating layer on the exposed face of the first insulating layer;
  forming a second via hole in the adhesion insulating layer and the first insulating layer, the second via hole reaching the first wiring layer;
  roughening an exposed face of the adhesion insulating layer; and
  forming a third wiring layer on the exposed face of the adhesion insulating layer, the third wiring layer connected to the first wiring layer through the second via hole.

(Clause 2) The method of manufacturing a wiring substrate according to clause 1, wherein the first via hole has a tapered shape whose diameter is set small gradually from the surface of the second insulating layer toward a thickness direction thereof, and
  the second via hole has a tapered shape reverse to the shape of the first via hole.

(Clause 3) The method of manufacturing a wiring substrate according to clause 1, wherein in the roughening the exposed face of the adhesion insulating layer, surface roughness of the exposed face of the adhesion insulating layer is set within the same range as that of surface roughness of an upper face of each of the first insulating layer and the second insulating layer.

(Clause 4) The method of manufacturing a wiring substrate according to clause 1, wherein the first to third wiring layers are formed by a semi-additive method.

(Clause 5) The method of manufacturing a wiring substrate according to clause 1, wherein the roughening the adhesion insulating layer is performed by a desmear process.

(Clause 6) The method of manufacturing a wiring substrate according to clause 1, wherein the first and second insulating layers and the adhesion insulating layer are formed of resin.

What is claimed is:

1. A wiring substrate, comprising:
   a first insulating layer;
   an adhesion insulating layer formed under the first insulating layer, and an outer face of the adhesion insulating layer is made to a roughened face;
   a first wiring layer formed on the first insulating layer;
   a second insulating layer formed on the first insulating layer, and in which a first via hole reaching the first wiring layer is provided;
   a second wiring layer formed on the second insulating layer, and connected to the first wiring layer through the first via hole;
   a second via hole formed in the adhesion insulating layer and the first insulating layer, and reaching the first wiring layer; and
   a third wiring layer formed on the outer face of the adhesion insulating layer, and connected to the first wiring layer through the second via hole,
   wherein surface roughness of the outer face of the adhesion insulating layer is set within a range of 100 nm to 500 nm, and set within the same range as surface roughness of an upper face of each of the first insulating layer and the second insulating layer, and
   wherein the surface roughness of the outer face of the adhesion insulating layer is larger than surface roughness of a lower face of the first insulating layer.

2. The wiring substrate according to claim 1, wherein
   the first via hole has a tapered shape whose diameter is set small gradually from the surface of the second insulating layer toward a thickness direction thereof, and
   the second via hole has a tapered shape reverse to the shape of the first via hole.

3. The wiring substrate according to claim 1, wherein the first insulating layer, the second insulating layer, and the adhesion insulating layer are formed of resin.

* * * * *